United States Patent [19]

Kaji et al.

[11] 3,975,818

[45] Aug. 24, 1976

[54] METHOD OF FORMING CLOSELY SPACED ELECTRODES ONTO SEMICONDUCTOR DEVICE

[75] Inventors: Tadao Kaji; Takeki Katsube, both of Kokubunji, Japan

[73] Assignee: Hitachi, Ltd., Japan

[22] Filed: June 26, 1974

[21] Appl. No.: 483,356

[30] Foreign Application Priority Data

Aug. 6, 1973  Japan.............................. 48-87493
July 30, 1973  Japan.............................. 48-84903
Aug. 6, 1973  Japan.............................. 48-87494
Aug. 8, 1973  Japan.............................. 48-88452

[52] U.S. Cl.................................. 29/578; 29/590; 29/591
[51] Int. Cl.²......................................... B01J 17/00
[58] Field of Search ............. 29/578, 590, 591, 571

[56] References Cited
UNITED STATES PATENTS 3,745,647  7/1973  Boleky................................ 29/571
3,783,500  1/1974  Tokuyama........................... 29/578

*Primary Examiner*—W. Tupman
*Attorney, Agent, or Firm*—Craig & Antonelli

[57] ABSTRACT

A method of forming at least two electrodes of a portion of a semiconductor device, the portion including one or more semiconductor regions and being covered with an insulating protective film, comprises the steps of providing a hole for the first electrode in the insulating protective film, forming the first electrode through the hole, rendering the surface of the first electrode insulative, providing a hole for the second electrode in the insulating protective film by employing the insulative surface of the first electrode as at least a part of a mask, and forming the second electrode through the second-mentioned hole, whereby the electrodes are situated in close proximity with the insulative surface of the first electrode interposed therebetween.

2 Claims, 38 Drawing Figures

METHOD OF FORMING CLOSELY SPACED ELECTRODES ONTO SEMICONDUCTOR DEVICE

BACKGROUND OF THE INVENTION

1. Field of the Invention

The present invention relates to a method of producing a semiconductor device, and more particularly to a method of forming closely spaced electrodes connected to various semiconductor regions.

2. Description of the Prior Art

During manufacture of semiconductor devices, it is necessary to form electrodes connected to various semiconductor regions and it is sometimes desirable to form electrodes as close together as possible, such as for high frequency operation or for decreasing the occupying area of the circuit elements in an integrated circuit, etc.

In prior art photoetching techniques, however, a minimum distance of 5–10$\mu$ between electrodes is necessary due to the limitations of mask registration precision and photoetching precision.

For example, in the manufacture of a bipolar transistor, as illustrated by a sectional view in FIG. 7 of the drawings, the distance $d$ between emitter electrode 7 and base electrode 8 must be approximately 5–10$\mu$ due to the limitations on the mask registration precision and photoetching resolution precision; hence, base region 4 must be made larger than is necessary in order to take into account inaccuracies in mask registration and photoetching.

Similarly, in the manufacture of a diffused resistor, as illustrated in the sectional view of FIG. 8, there is a minimum distance $d$ between the two contacts 7 and 8 for the reasons discussed above. Accordingly, in order to form a diffused resistor having a low resistance with such limitations, it is necessary to enlarge the width of the diffused region. Thus, the degree of integration must be sacrificed, so that, in addition to the lowering of the degree of integration, the problem of increase in the parasitic capacitance is involved.

Similar problems also occur in the manufacture of junction capacitors and junction type field effect transistors.

SUMMARY OF THE INVENTION

It is, accordingly, an object of this invention to provide an improved method of forming electrodes, which are very closely spaced from each other, for various semiconductor regions.

It is another object to increase the degree of integration of circuit elements in an integrated circuit.

It is a further object to provide a transistor of low base resistance $r_{bb}$ and base-collector junction capacitance $C_{BC}$.

It is a still further object to provide a resistor of a low resistance within an integrated circuit without lowering the density of integration.

It is a still further object to provide a junction type field effect transistor of a reduced parasitic capacitance and a reduced channel resistance.

It is a still further object of providing a junction capacitor of a high quality factor Q and of a low series resistance.

According to one aspect of this invention, in the formation of electrodes in proximity on both sides of p-n junction covered with an insulating protective film in a method of producing a semiconductor device such as a bipolar transistor, a junction type field effect transistor, or a junction type capacitor, a first electrode is formed so as to be connected with one semiconductor region and so as to cover the p-n junction with an insulating protective film interposed between the first electrode and the semiconductor surface. A surface of the first electrode is converted to an insulative substance, the insulating protective film on the other semiconductor region is removed using the insulating substance of the first electrode as a mask, and a second electrode is connected with this semiconductor region.

In another aspect of this invention, in forming electrodes for a semiconductor region covered with an insulating protective film, for producing a diffused resistance of a low resistance, a first electrode is formed after providing an opening in the insulating protective film, a surface of the first electrode is converted to an insulative substance, the insulating protective film is selectively removed to form an opening using the insulating substance of the material of the first electrode as at least a part of a mask, and the second electrode is thereafter formed in the last mentioned opening.

DETAILED DESCRIPTION

Embodiment 1

Shown in FIGS. 1a to 1h are sectional views illustrative of an example of a method according to the present invention for producing a transistor.

Figure 1A:
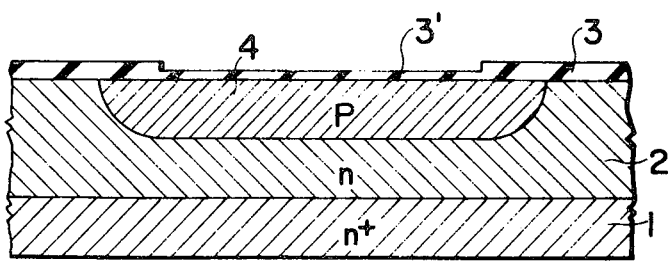
FIG. 1a to 1h are sectional views of part of a semiconductor wafer in various steps of manufacturing a transistor according to this invention.

As illustrated in FIG. 1a, a monocrystalline semiconductor wafer of, for example, silicon is prepared. The wafer includes a heavily doped n-type silicon substrate 1 and a thin n-type epitaxial layer 2 of high resistivity grown on the substrate 1. By a conventional selective diffusion technique, a p-type impurity, such as boron is selectively diffused into the epitaxial layer 2 using a silicon oxide ($SiO_2$) film 3, 8,000 to 10,000 A thick, as a mask to form the p-type base region 4. A further silicon oxide film 3' of 2,000 to 5,000 A thick is formed on the base region 4 during diffusion of the p-type impurity.

Figure 1B:
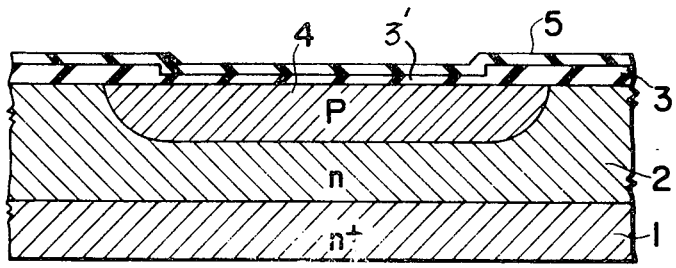

Next, as shown in FIG. 1b, on the $SiO_2$ films 3 and 3', an $Al_2O_3$ film 5, 3,000 A thick is formed by conventional sputtering techniques.

Figure 1C:
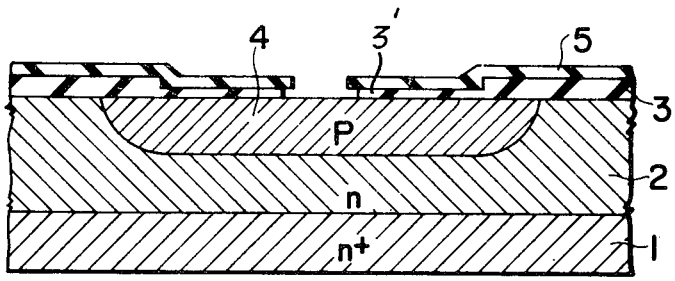

As depicted in FIG. 1c, the $Al_2O_3$ film 5 is then selectively removed with an etchant including phosphoric acid by conventional photoetching techniques, and the $SiO_2$ film 3' is selectively removed with an etchant including hydro-fluoric acid by employing the resultant $Al_2O_3$ film 5 as a mask.

Figure 1D:
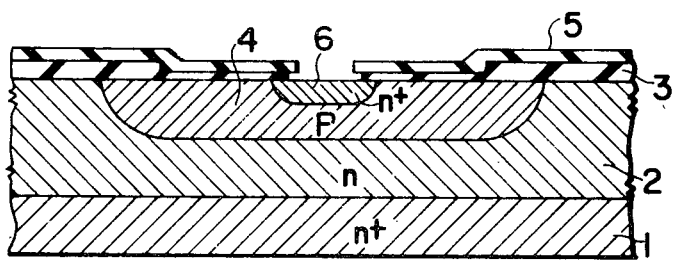

Then, as shown in FIG. 1d, an n-type impurity, for example, phosphorus, is diffused through the resultant opening to form the emitter region 6. An $SiO_2$ film (not shown) formed on the surface of the emitter region 6 during the diffusion and formation of the emitter region 6 is etched and removed with the hydro-fluroic acid etchant, as mentioned above. That is, an emitter electrode opening is formed by a conventional washed emitter technique.

Figure 1E:
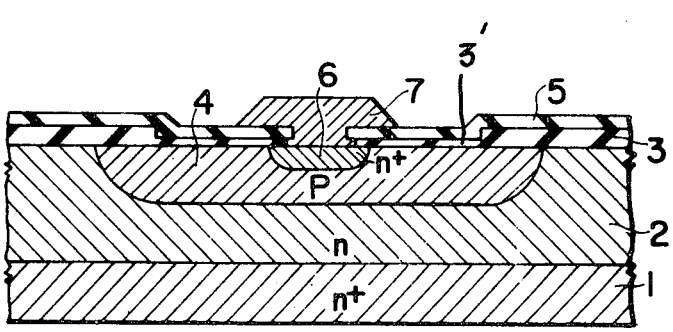

Next, as shown in FIG. 1e, aluminum is evaporated onto the surface of the resulting wafer of the above construction to a thickness of about 10,000 –20,000 A, whereupon the Al layer is selectively etched to form an emitter electrode 7. This emitter electrode 7 is so formed as to cover at least the p-n junction between the base and emitter with the $SiO_2$ film 3' and the $Al_2O_3$ film 5 interposed therebetween.

Figure 1F:
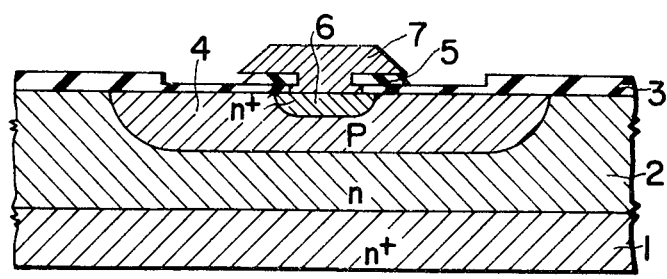

Then, as shown in FIG. 1f, the emitter electrode 7 is employed as a mask, so that the $Al_2O_3$ film 5 is etched and removed by utilizing a phosphoric acid etchant leaving film 5 only beneath the electrode layer 7.

Figure 1G:
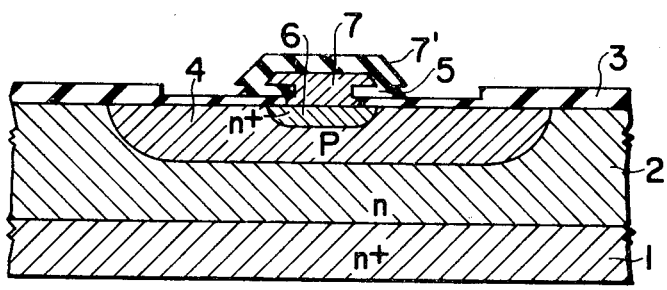

The surface of Al layer, as the emitter electrode 7, is then anodized to form an $Al_2O_3$ film 7' of about 3,000 A to 60,000 A thick in the surface of the emitter electrode 7 as shown in FIG. 1g. 1g.

Figure 1H:
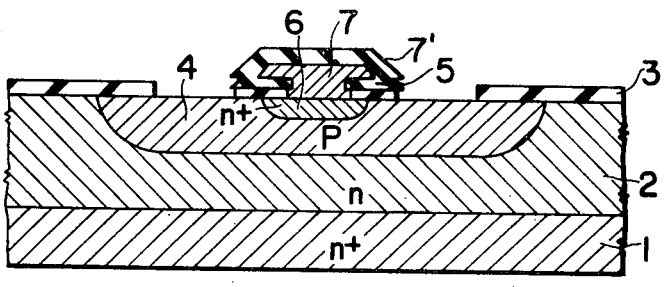

Then, the wafer thus obtained is dipped into a hydro-fluoric acid etchant. The $SiO_2$ films 3 and 3' which are not covered with the $Al_2O_3$ films 5 and 7' are removed by the etchant. As a result, the $SiO_2$ film 3' not covered with the $Al_2O_3$ films is etched away to form an opening exposing part of the base region 4, while the thickness of $SiO_2$ film 3 is reduced, but the film 3 still remains on the wafer. This is shown in FIG. 1h. Thus, the edge of the opening at the emitter side is defined by the $Al_2O_3$ films 5 and 7', while the edge of the opening at the collector side is defined by the thick $SiO_2$ film 3. In other words, the opening is self-aligned with the emitter electrode 7.

Figure 2:
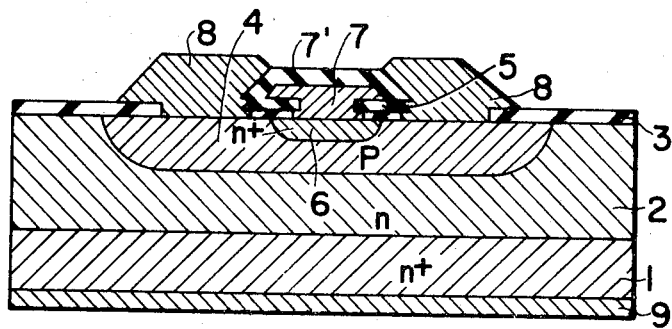
FIG. 2 is a sectional view of the transistor manufactured through the steps illustrated in FIGS. 1a to 1h.

Thereafter, the base electrode 8 and a collector electrode 9, both of aluminum, are formed as shown in FIG. 2.

Figure 7:
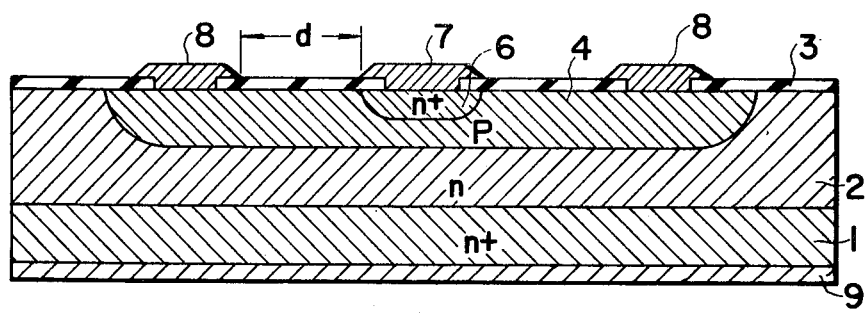
FIG. 7 is a sectional view of a transistor manufactured by a prior art method.
Figure 8:
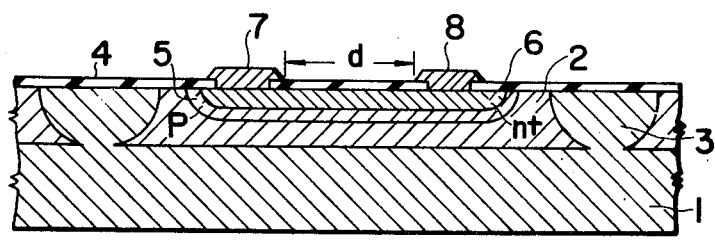
FIG. 8 is a sectional view of a diffused resistor manufactured by a prior art method.

According to the above embodiment, it is not necessary to establish a distance $d$ which would be restricted by the precision of mask registration and photoetching resolution, between the emitter electrode and the base electrode, as in the prior-art transistor illustrated in FIG. 7. The emitter electrode and the base electrode can, consequently, be formed in close proximity to each other, so that the base region can be made small. Therefore, both the base resistance $r_{bb}$ and the base-collector junction capacitance $C_{BC}$ become low, making it possible to improve the high frequency characteristics. Moreover, since the chip area of the transistor becomes small, the pellet yield per wafer becomes high, while the enhancement of the density of integration can be expected when the invention is applied to an integrated circuit.

Embodiment 2

Figure 3A:
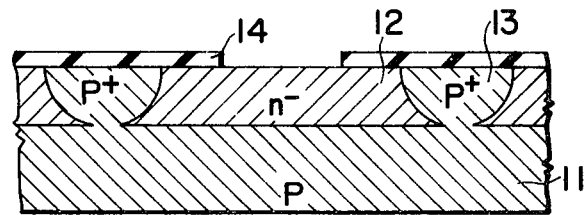
FIGS. 3a to 3h are sectional views of part of a semiconductor wafer in various steps of manufacturing a junction type capacitor according to this invention.
Figure 3B:
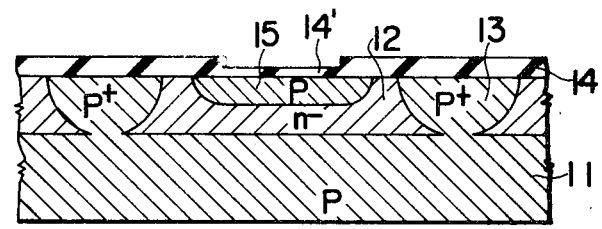
Figure 3C:
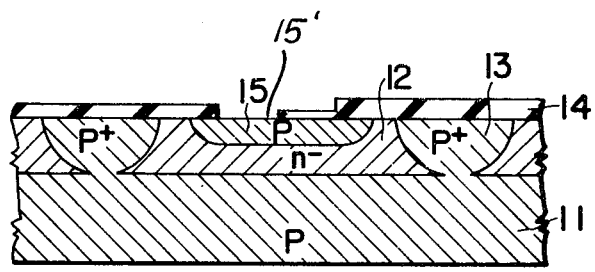
Figure 3D:
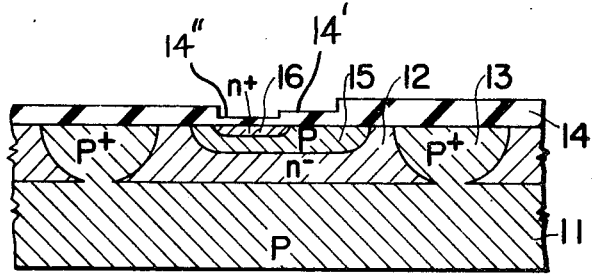
Figure 3E:
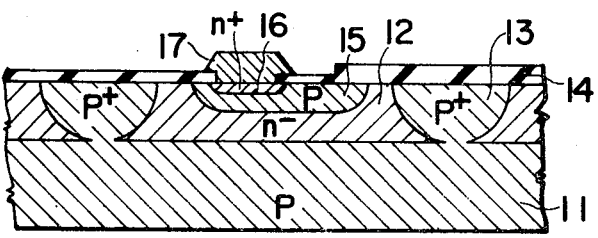
Figure 3F:
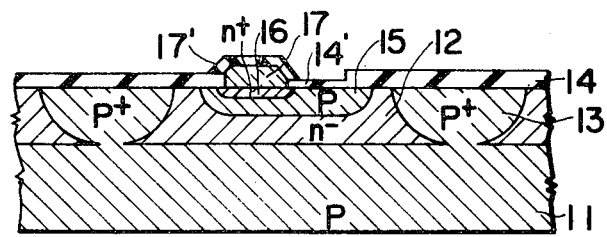
Figure 3G:
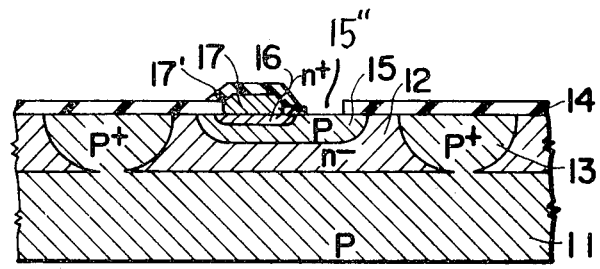
Figure 3H:
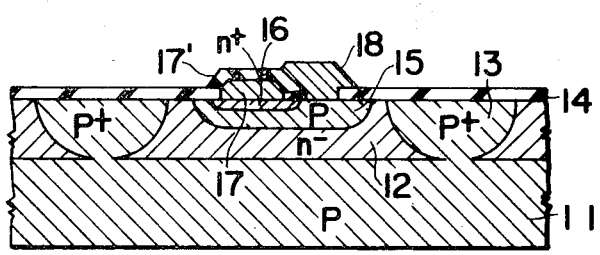

FIGS. 3a and 3h show sectional views illustrative of an example of a method according to the present invention for forming electrodes in a junction type capacitor which utilizes the junction capacitance between regions formed simultaneously with an emitter and a base.

First, as shown in FIG. 3a, a monocrystalline semiconductor wafer of, for example, silicon is prepared. The wafer includes a p-type silicon substrate 11 and a thin $n^-$-type silicon layer of about $10\mu$ thickness epitaxially grown on the substrate 11. By diffusing a p-type impurity, boron for example, into the epitaxial layer using a silicon oxide ($SiO_2$) film 14 10,000 A thick as a mask, by conventional selective diffusion techniques, a p-type isolation region 13 is formed so as to isolate the epitaxial region or an island region 12 from other epitaxial regions. Then, a window, exposing a surface portion of the epitaxial region 12, is formed in the $SiO_2$ film 14.

Next, as illustrated in FIG. 3b, employing the $SiO_2$ film 14 as a mask, a p-type region 15 is formed by diffusion simultaneously with a base which is formed in another island region (not shown). During the diffusion, a new $SiO_2$ film 14' about 4,000 A thick forms on the p-type region 15. In the $SiO_2$ film 14', an opening 15' is formed to expose part of the p-type region 15 as shown in FIG. 3c.

Then, as shown in FIG. 3d, employing the $SiO_2$ films 14 and 14' as a mask, an $n^+$-type region 16 is formed by diffusion simultaneously with an emitter which is formed in another portion of the semiconductor wafer (not shown). A suitable n-type impurity for $n^+$-type region 16 is, for example, phosphorus. A further thin $SiO_2$ film 14'' is grown on the $N^+$-type region during the diffusion.

Next, as shown in FIG. 3e, the wafer thus obtained is dipped in a hydro-fluoric acid etchant which attacks the $SiO_2$ films to remove the further thin $SiO_2$ film on the region 16; although the thick $SiO_2$ films 14 and 14' are made thin, they remain on the semiconductor wafer. That is, the opening is formed by the so-called washed emitter technique which utilizes a difference in the thickness of the $SiO_2$ films. Then, aluminum is evaporated onto the wafer, whereupon the Al layer is selectively etched, to form an electrode 17 connected to the $n^+$-type region 16. This electrode 17 is so formed as to cover at least a part over the p-n junction between the $n^+$-type region 16 and the p-type region 15.

Next, as shown in FIG. 3f, the surface of the electrode 17 is anodized, to form an $Al_2O_3$ film 17', on the surface of the electrode 17.

The resultant wafer is then dipped into a hydro-fluoric acid etchant to etch the $SiO_2$ films 14 and 14', and the relatively thinner $SiO_2$ film 14' is etched away to form an opening 15'' exposing part of the p-type region 15 as shown in FIG. 3g. The edge of the opening is defined in part by the $Al_2O_3$ film 17' and in part by the edge of the relatively thick $SiO_2$ film 14. Thus, the opening is self-aligned with the electrode 17.

Then, as shown in FIG. 3h, electrode 18 is connected to the p-type region through the opening 15'', the electrode 18 being positioned in close proximity with the electrode 17.

According to the above embodiment the series resistance of the p-type diffused layer 15 up to the electrode 18 can be made small, making it possible to enhance the Q of the capacitor and to diminish the parasitic capacitance. Also, the two electrodes are opposed with the very thin insulating film 17' interposed therebetween, so that a MIS capacitor owing to this structure is added to the junction capacitance, which makes it possible to obtain a high capacitance. Further, since the occupying area becomes small, the enhancement of the degree of integration can, of course, be achieved.

Embodiment 3

Shown in FIGS. 4a to 4j are sectional views illustrative of an example of a method according to the present invention for producing a junction field-effect transistor.

Figure 4A:
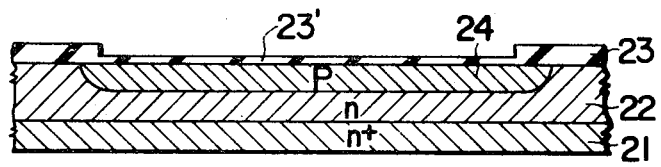
FIGS. 4a to 4j are sectional views of part of a semiconductor wafer in various steps of manufacturing a junction type field effect transistor according to this invention.

As shown in FIG. 4a, an $SiO_2$ film 23 is formed on the surface of an n-type epitaxial layer 22 which is epitaxially grown on an $n^+$-type substrate 21. The $SiO_2$ film 23 is selectively removed, and a p-type channel region 24 is formed by conventional diffusion techniques. During the diffusion, a thin $SiO_2$ film 23' is grown on the p-type region 24.

Figure 4B:
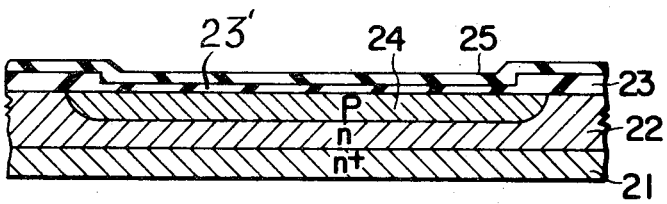

Then, as illustrated in FIG. 4b, an $Al_2O_3$ film 25 is deposited on the entire area of the $SiO_2$ films 23 and 23' by sputtering techniques.

Figure 4C:
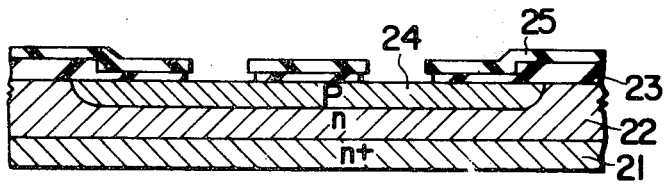

In order to form a gate region, the $Al_2O_3$ film 25 is selectively removed with a phosphoric acid etchant, and the $SiO_2$ film 23' is selectively removed with a hydro-fluoric acid etchant by employing the resultant $Al_2O_3$ film 25 as a mask as shown in FIG. 4c.

Figure 4D:
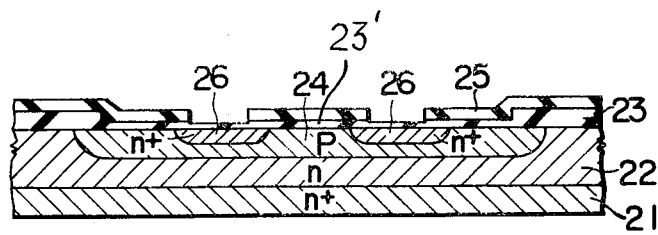

Next, using the $Al_2O_3$ film 25 and the $SiO_2$ films 23 and 23' as a mask, the $n^+$-type gate region 26 is formed by diffusion as shown in FIG. 4d.

Figure 4E:
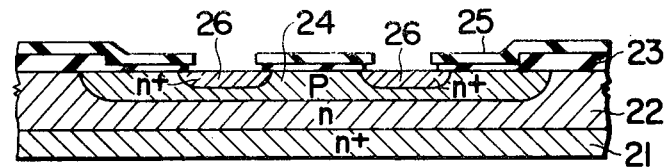

Then, as shown in FIG. 4e, the $SiO_2$ film formed on the surface of the gate region 26 during the diffusion of the gate region 26 is etched and removed with a hydro-fluoric acid etchant, using the $Al_2O_3$ film 25 as a mask.

Figure 4F:
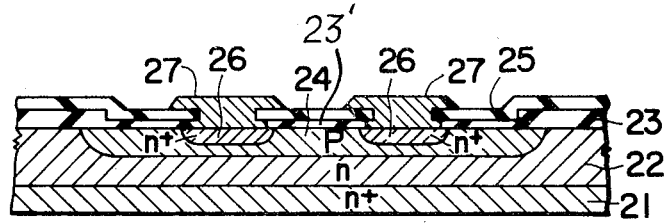

Aluminum is then evaporated onto the surface of the resultant wafer, whereupon the Al layer is selectively removed by etching, to form an annular-shaped gate electrode 27 as illustrated in FIG. 4f. This gate electrode 27 is so formed as to cover at least the p-n junction between the gate region 26 and the channel region 24 with the $SiO_2$ film 23' and the $Al_2O_3$ film 25 interposed therebetween.

Figure 4G:
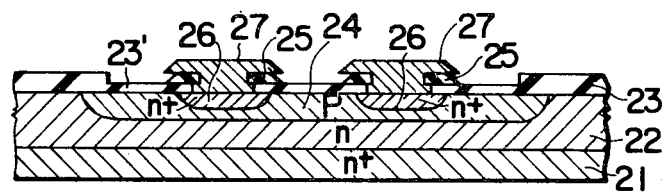

Next, as shown in FIG. 4g, employing the gate electrode as a mask, the $Al_2O_3$ film 25 is etched and removed by utilizing the etchant of the phosphoric acid leaving only a portion beneath the electrode 27.

Figure 4H:
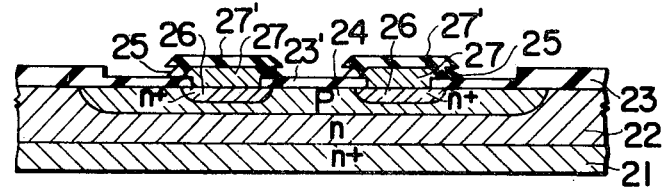

The surface of the gate electrode 27 is then anodized, to form an $Al_2O_3$ film 27', on the gate electrode surface as shown in FIG. 4h.

Figure 4I:
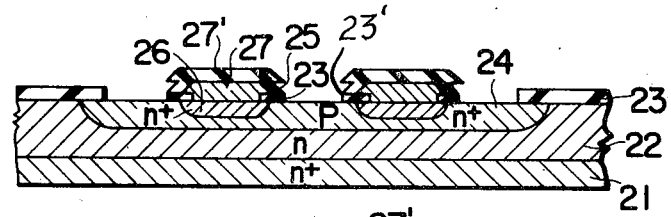

Next, as shown in FIG. 4i, in the $SiO_2$ film 23', openings for source and drain electrodes are respectively provided by dipping the wafer into a hydro-fluoric acid etchant. The etchant attacks the $SiO_2$ films 23 and 23' which are not covered with the $Al_2O_3$ films 25 and 27', and part of the $SiO_2$ film 23'is removed to form the openings for source and drain electrodes, while the $SiO_2$ film 23 remains on the wafer although its thickness is reduced. Thus, the openings are self-aligned with the gate electrode 27.

Figure 4J:
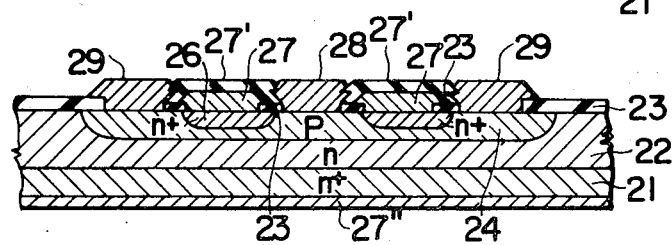
Figure 5:
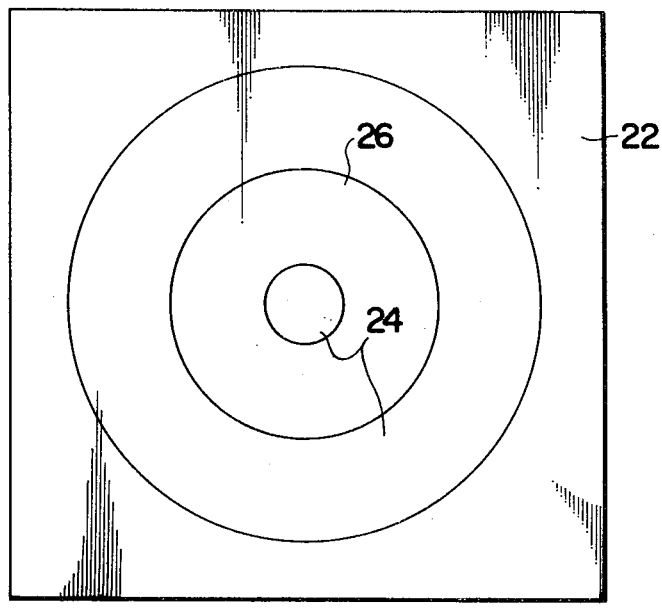
FIG. 5 is a plan view of the field effect transistor manufactured through the steps illustrated in FIGS. 4a to 4j.

Then, as illustrated in FIG. 4j, drain electrode 28 and source electrode 29 are connected through the openings. Further, on the back of the wafer a second gate electrode 27'' is formed. As is illustrated in FIG. 5, the gate region 26 is formed into a ring shape, so that the gate electrode 27, the source electrode 29 and the drain electrode 28 are respectively formed on the ring-shaped gate region 26, on the outside channel region 24 and on the inside channel region 24.

The electrodes can consequently be formed in close proximity to each other, so that the channel region 24 can be made small. Therefore, the lowering of the series loss resistance and the parasitic capacitance of the channel region can be provided. Also, since the chip area of the transistor becomes small, the pellet yield per wafer becomes high, while the enhancement of the density of integration can be expected when the invention is applied to an integrated circuit.

Embodiment 4

FIGS. 6a to 6h show sectional views illustrative of an example of a method according to the present invention for forming electrodes in a diffused resistor of a low resistance within an integrated circuit.

Figure 6A:
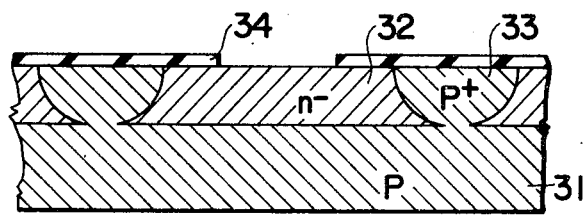
FIGS. 6a to 6h are sectional views of part of a semiconductor wafer in various steps of manufacturing a diffused resistor according to this invention.

First, as shown in FIG. 6a, similar to Embodiment 2, a monocrystalline semiconductor wafer is prepared, which includes a p-type silicon substrate 31, an n-type island region 32 of epitaxially grown silicon which is isolated from other regions by the isolation region 33, and an $SiO_2$ film 34 having an opening therethrough.

Figure 6B:
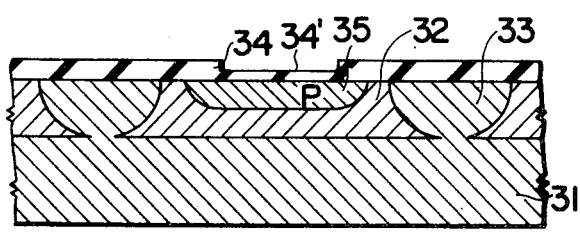

Next, as shown in FIG. 6b, using the $SiO_2$ film 34 as a mask, p-type region 35 is formed by diffusion simultaneously with a base. During diffusion, a thin $SiO_2$ film 34' is grown on the diffused region 35.

Figure 6C:
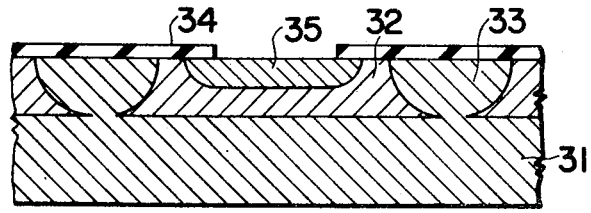

The resultant wafer is then dipped in a hydro-fluoric acid etchant to remove the thin $SiO_2$ film 34' while the $SiO_2$ film 34 is retained although its thickness is reduced by the attack of the etchant, as shown in FIG. 6c.

Figure 6D:
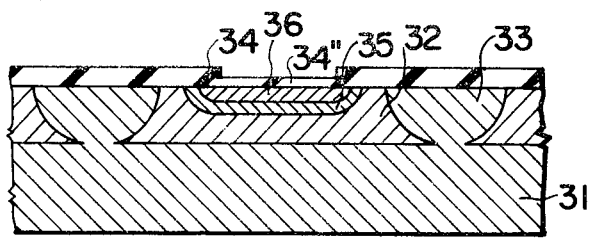

Then, as shown in FIG. 6d, using the $SiO_2$ film 34 as a mask, an $n^+$-type region 36 is formed by diffusion simultaneously with an emitter. During diffusion, a thin $SiO_2$ film 34'' is formed on the $n^+$-type region 36.

Figure 6E:
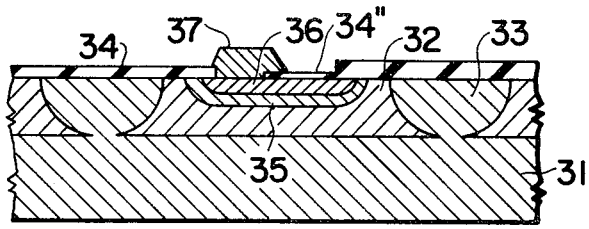

In using the $n^+$-type region 36 as a resistor, in order to first form one electrode, the $SiO_2$ film 34'' is selectively etched and removed. Subsequently, Al is evaporated onto the wafer surface, whereupon the Al layer is selectively etched, to form the electrode 37 connected to the $n^+$-type region 36. This electrode 37 is so formed as to lie on the $SiO_2$ films 34 and 34'' at its peripheral part as illustrated in FIG. 6e.

Figure 6F:
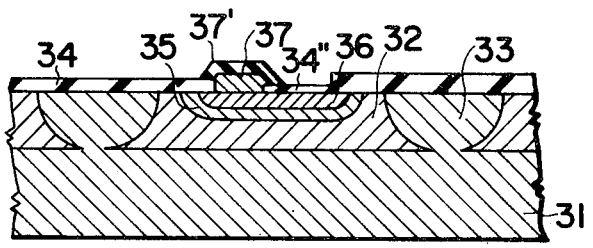

Next, as shown in FIG. 6f, the surface of the electrode 37 is anodized to form an $Al_2O_3$ film 37' on the surface of the electrode 37.

Figure 6G:
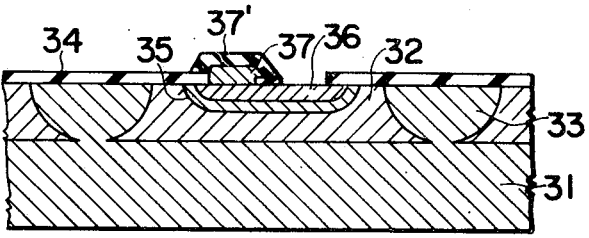

The resultant wafer is then dipped into a hydrofluoric acid etchant to remove the thin $SiO_2$ film 34'' which is not covered with the $Al_2O_3$ film 37', while the thick $SiO_2$ film 34 is retained on the wafer as depicted in FIG. 6g.

Figure 6H:
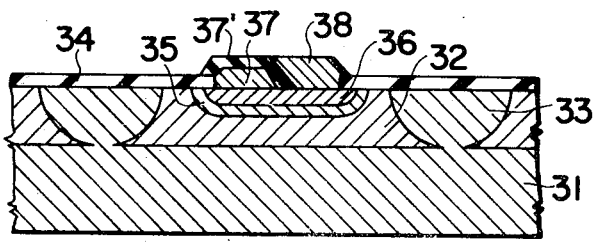

Then, another electrode 38 is connected to the $n^+$-type region through the opening. The electrode 38 thus obtained is self-aligned with the electrode 37 and therefore they are positioned in an extremely closely spaced relationship to each other, as shown in FIG. 6h.

Consequently, a low resistance can be formed without making the width of the diffused region large, and a decrease in the degree of integration does not result. Also, since the size is made small, the parasitic capacitance can be made low.

The present invention is not restricted to the foregoing embodiments, but can adopt various aspects of performance. In the present invention, it is essentially required that the etchants for the insulating film of the surface of the first electrode and for the insulating protective film of the surface of the substrate are different, and hence, by way of example, if the electrodes are of conductive polycrystalline silicon, the performance is possible substantially in the same manner as in the foregoing by utilizing $Si_3N_4$, $Al_2O_3$ or the like for the insulating protective film of the substrate.

The producing process may also be such that for example, after forming the emitter electrode as shown in FIG. 1e, an opening for the base electrode is provided without rendering the surface of the emitter electrode insulative, the emitter electrode surface is subsequently rendered insulative, the insulating film is thereafer removed for the emitter electrode, and the base electrode is formed.

Further, in Embodiment 4, the p-type diffused region 35 may be used as a resistor without forming the $n^+$-type region 36. In this case, the electrodes 37 and 38 are similarly connected to the p-type region 35.

While we have shown and described several embodiments in accordance with the present invention, it is understood that the same is not limited thereto but also contemplates numerous changes and modifications as would be known to those skilled in the art given the present disclosure of the invention, and we therefore do not wish to be limited to the details shown and described herein only schematically but intend to cover all such changes and modifications.

What we claim is:

1. A method of manufacturing a semiconductor device comprising the steps of:
   a. forming a first semiconductor region of a first conductivity type in a first portion of the surface of a semi-conductor substrate of a second conductivity type, opposite said first conductivity type;
   b. forming a first semiconductor region of said second conductivity type in a portion of said first semiconductor region, thereby defining a first p-n junction therebetween which extends to said surface of said substrate;
   c. selectively forming a first layer of insulating material on said surface of said substrate so as to cover said first p-n junction and having an opening therethrough exposing one of said first and second semiconductor regions;
   d. forming a first electrode through said first opening onto said one of said semiconductor regions so as to partially overlie said first layer of insulating material and overlapping that portion of said first layer of insulating material overlying said first p-n junction;
   e. converting the exposed surface portion of said first electrode to a second layer of insulating material, so that said second layer of insulating material is contiguous to the portion of said first layer of insulating material which said first electrode partially overlies;
   f. forming a second hole in said first layer of insulating material so that an edge of said second hole is in registration with the edge of said second layer of insulating material and said second hole exposes the other of said first and second regions; and
   g. forming a second electrode through said second hole onto said other of said semiconductor regions.

2. A method according to claim 1, wherein step (f) comprises applying an etchant to said first and second layers of insulating material with respect to which said second layer of insulating material is substantially impervious, but said first layer of insulating material is etched thereby.

* * * * *